(12) United States Patent
Kono

(10) Patent No.: US 6,232,824 B1
(45) Date of Patent: May 15, 2001

(54) SEMICONDUCTOR DEVICE CAPABLE OF SUPPRESSING TRANSIENT VARIATION IN LEVEL OF INTERNAL POWER SUPPLY POTENTIAL

(75) Inventor: Takashi Kono, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/440,553

(22) Filed: Nov. 15, 1999

(30) Foreign Application Priority Data

May 14, 1999 (JP) .................................................. 11-133711

(51) Int. Cl.[7] ...................................................... G05F 1/10

(52) U.S. Cl. ............................................ 327/530; 327/407

(58) Field of Search ..................................... 327/407, 408, 327/411, 530, 544; 365/189.09, 227

(56) References Cited

U.S. PATENT DOCUMENTS

| | | | |
|---|---|---|---|
| 5,075,569 | * 12/1991 | Branson | 327/407 |
| 5,426,616 | * 6/1995 | Kajigaya et al. | 327/544 |
| 5,650,672 | * 7/1997 | Curd | 307/130 |

FOREIGN PATENT DOCUMENTS

| | | |
|---|---|---|
| 5-62481 | 3/1993 | (JP) . |
| 6-215571 | 8/1994 | (JP) . |

* cited by examiner

Primary Examiner—Jung Ho Kim
(74) Attorney, Agent, or Firm—McDermott, Will & Emery

(57) ABSTRACT

First and second buffer circuits generate first and second reference potentials. A switching circuit selects a first reference potential as a reference potential while a sense operation is not performed and selects a lower second reference potential while the sense operation is performed. A buffer circuit is controlled such that a through current increases only for a predetermined time period at a initiation and a termination of the sense operation.

11 Claims, 15 Drawing Sheets

SEMICONDUCTOR DEVICE CAPABLE OF SUPPRESSING TRANSIENT VARIATION IN LEVEL OF INTERNAL POWER SUPPLY POTENTIAL

BACKGROUND OF THE INVENTION

Field of the Invention

The present invention relates to a structure of a semiconductor device having an internal potential generation circuit receiving an external power supply potential and generating an internal power supply potential.

Description of the Background Art

As a result of a rapidly growing popularity of portable information terminal equipment in recent years, storage element mounted on such equipment is required to operate for a long time by battery.

Mostly, a dynamic random access memory (hereinafter referred to as DRAM) is mounted as such storage element on portable information terminal equipment because of a low cost per bit. Data written in the DRAM is lost by degrees when abandoned. Therefore, an operation called "refresh operation" is necessary for holding data.

One way for reducing a current Iccsr consumed in the DRAM during the refresh operation is to optimize a design of a circuit portion where a current constantly flows and to reduce a through current constantly flowing through this circuit portion. Here, it is also preferable that a so-called standby current Iccs is reduced. For this purpose, again, the reduction of the constant through current as mentioned above is important. Hereinafter, an internal potential generation circuit generating an internal potential of a DRAM will be described as an example of such circuit where a constant current flows in the DRAM.

The internal potential generation circuit greatly contributes to the reduction of a current consumed during the operation of the DRAM because it supplies a predetermined lower potential than an external power supply voltage to internal circuitry of the DRAM. It is important to set an internal power supply potential Vdds output from the internal potential generation circuit at a lower level especially for the reduction of a current Iccsr consumed during the refresh operation.

FIG. 17 is a schematic block diagram referenced for describing a structure of a conventional internal potential generation circuit 8000 including a voltage conversion circuit 8040 for a sense amplifier for supplying internal power supply potential Vdds to a sense amplifier S/A of a DRAM.

The conventional internal potential generation circuit 8000 includes a constant current source 8010 receiving an external power supply potential Vcc and a ground potential Vss for operation and generating bias potentials VBH and VBL for defining an amount of a through current of internal potential generation circuit 8000; a Vref generation circuit 8020 receiving external power supply potential Vcc and ground potential Vss for operation and generating a basic reference potential Vref for generating an internal power supply potential Vdds based on bias potential VBH; a buffer circuit 8030 receiving bias potential VBL and basic reference potential Vref and generating a reference potential VrefM for generating internal power supply potential Vdds; and a voltage conversion circuit 8040 receiving reference potential VrefM, activated by a signal QON and supplying internal power supply potential Vdds as an output.

In an example shown in FIG. 17, sense amplifier S/A is supplied with internal power supply potential Vdds via a p-channel MOS transistor TPO controlled by a signal ZSOP, and is supplied with ground potential Vss via an n-channel MOS transistor TNO controlled by a signal SON.

Sense amplifier S/A is connected to a plurality of memory cells MC via bit line pairs BL and /BL. In FIG. 17, only a single memory cell MC is shown to be connected to sense amplifier S/A via a bit line BL as an example. A precharge/equalize circuit 8100 for equalizing potential levels of paired bit lines BL and /BL in response to a signal BLEQ and for turning the potential levels to a precharge potential level is provided between paired bit lines BL and /BL.

Memory cell MC connected to bit line BL includes a memory cell transistor TM opening and closing according to a potential level of word line WL and a memory cell capacitor Cs having one end coupled to a cell plate potential Vcp and another end connectable to bit line BL via transistor TM. Here, in general, the cell plate potential takes a level half a potential corresponding to an "H" level data stored in the memory cell capacitor.

In the structure as shown in FIG. 17, the current consumed during operations can be reduced because internal power supply potential Vdds lower than the external power supply potential is supplied to sense amplifier S/A as described above.

However, as the level of internal power supply potential Vdds is low at the time of initiation of a sense operation, a gate-source potential Vgs of the transistor constituting sense amplifier S/A becomes low. This causes a delay of the sense operation by sense amplifier S/A.

In addition, with the decrease in chip area, a ratio (Cpb/Cb) of decoupling capacitance Cpb present on an interconnection between voltage conversion circuit 8040 and sense amplifier S/A to capacitance Cb charged and discharged to and from bit line BL and /BL at the sense operation tends to decrease. Before the initiation of the sense operation, capacitance Cpb holds the potential level of internal power supply potential Vdds. Under this condition, electrical charges are supplied from capacitance Cpb into charge/discharge capacitance Cb during a period from the start of the sense operation to the time voltage conversion circuit 8040 actually starts to supply internal power supply potential Vdds of a given level. Therefore, the decrease in capacitance ratio Cpb/Cb means increase in an amount of transient decrease of internal power supply potential Vdds supplied from the sense amplifier S/A compared with a desired level.

The larger transient decrease of internal power supply potential Vdds level means increase in delay of the sense operation as described above. Therefore, if a period where internal power supply potential Vdds transiently decreases is required to be shortened for the suppression of delay of sense operation, current supplying capability of internal potential generation circuit 8000 must be increased also in the transient period described above. This leads to a problem of increase in standby current of internal potential generation circuit 8000.

SUMMARY OF THE INVENTION

An object of the present invention is to provide an internal potential generation circuit capable of suppressing a standby current value while suppressing a transient variation in level of an internal power supply potential supplied from an internal voltage down converting circuit.

In brief, the present invention is a semiconductor device including a reference potential generation circuit and an internal circuit.

The reference potential generation circuit receives an external power supply potential and selectively outputting one of a plurality of reference potentials according to an operation mode. The reference potential generation circuit includes a plurality of potential generation circuits each generating one of the plurality of reference potentials and increasing a current driving capability at least for a predetermined time period after the transition of the operation mode, and a switching circuit receiving outputs of the plurality of potential generation circuit and supplying one of the outputs through switching according to the operation mode. The internal circuit operates based on the output of the reference potential generation circuit.

Preferably, in the semiconductor device according to the present invention, the potential generation circuits each include a basic reference potential generation circuit generating a basic reference potential corresponding to the reference potential to be generated, and a buffer circuit supplying the reference potential as an output according to the basic reference potential. The buffer circuit includes an output node, a drive circuit receiving the external power supply potential and driving a potential level of the output node to the reference potential according to the basic reference potential, and a current control circuit enhancing a current flow through the drive circuit in an active state at least for the predetermined time period after the transition of the operation mode.

In accordance with another aspect, the present invention is a semiconductor device including an internal circuit, an interconnection, and an internal potential generation circuit.

The internal circuit is driven by an internal potential. The interconnection transmits the internal potential to the internal circuit.

The internal potential generation circuit receives an external power supply potential and selectively supplies to the interconnection one of a first potential and a second potential higher than the first potential as the internal potential according to an operation mode.

The internal potential generation circuit includes a reference potential generation circuit supplying as an output first and second reference potentials corresponding to the first and the second potentials, respectively, according to the operation mode and increasing a current driving capability at least for a predetermined time period after the transition of the operation mode, and a voltage conversion circuit having an input node which receives an output of the reference potential generation circuit and generating the internal potential.

The voltage conversion circuit includes an MOS transistor having a gate coupled to the input node.

Preferably, in the semiconductor device according to the present invention, the reference potential generation circuit includes; a first basic reference potential generation circuit generating a first basic reference potential corresponding to the first reference potential; a second basic reference potential generation circuit generating a second basic reference potential corresponding to the second reference potential; a first buffer circuit supplying the first reference potential as an output according to the first basic reference potential; a second buffer circuit supplying the second reference potential as an output according to the second basic reference potential; and a switching circuit receiving outputs of the first and second buffer circuits and selectively supplying as an output one of the outputs according to the operation mode.

The first buffer circuit and the second buffer circuit each include, an output node, a drive circuit receiving the external power supply potential to drive a potential level of the output node to a corresponding one of the first and the second reference potentials according to a corresponding one of the first and second basic reference potentials, and a current control circuit enhancing a current flow through the drive circuit in an active state at least for the predetermined time period after the transition of the operation mode.

More preferably, in the semiconductor device according to the present invention, the internal circuit includes: a control circuit controlling an operation of the internal circuit according to a supplied control signal; a memory cell array including a plurality of dynamic type memory cells arranged in a matrix; a plurality of bit line pairs provided corresponding to columns of the memory cells; a memory cell select circuit selecting a corresponding one of the memory cells according to an address signal; a plurality of sense amplifiers amplifying a potential of a bit line pair coupled to the selected memory cell based on data held in the selected memory cell; and a sense amplifier drive circuit controlled by the control circuit to control a supply of the internal potential to the sense amplifier, and the transition of the operation mode corresponds to a transition of sense operation by the sense amplifier between an active state and an inactive state.

Therefore, a main advantage of the present invention lies in that the variation in potential caused by interference between the reference potentials can be suppressed even when the level of the reference potential output from the reference potential generation circuit is switched according to the operation mode.

Another advantage of the present invention is that the transient shift of the output level from a desired level can be suppressed even when the output level supplied from the internal potential generation circuit is switched according to the operation mode, whereby the increase in power consumption can be suppressed.

Still another advantage of the present invention is that the transient shift of the driving potential from a desired level at the time of switching between an active state and an inactive state of the sense amplifier can be suppressed in the dynamic type semiconductor memory device, whereby the increase in power consumption can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
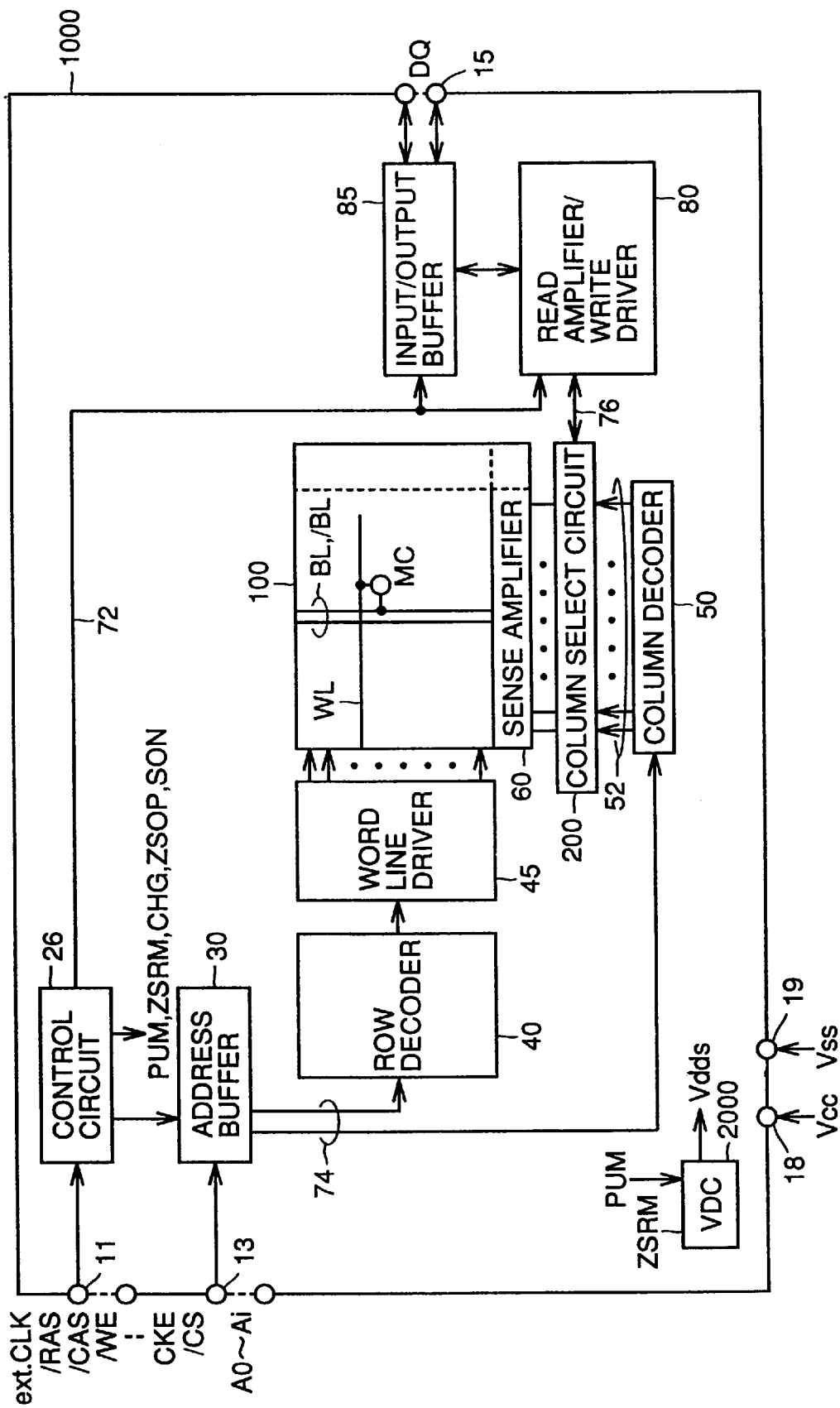
FIG. 1 is a schematic block diagram showing an overall structure of a DRAM 1000 according to the first embodiment of the present invention.

FIG. 1 is a schematic block diagram showing an overall structure of a DRAM 1000 according to the first embodiment of the present invention.

Here, as will become clear from the following description, the internal potential generation circuit according to the present invention is not solely employed to be mounted on DRAM 1000 as shown in FIG. 1 and can be adopted generally to a semiconductor device with an internal power supply potential generation circuit generating an internal power supply potential based on an external power supply potential Vcc. In addition, the internal potential generation circuit is not limited to a voltage down converting circuit described below as an example, and can be a boosting circuit in general. For example, the present invention can be applied to the internal potential generation circuit having a level detection circuit such as a boosting circuit, where a reference potential is switched to switch the level of internal potential level to be output in order to place hysteresis in a detection level.

With reference to FIG. 1, DRAM 1000 includes a group of control signal input terminals 11 receiving control signals such as external clock signal ext.CLK, row address strobe signal/RAS, column address strobe signal/CAS, write enable signal/WE, chip enable signal/CS, and clock enable signal CKE; a group of address input terminals 13 receiving an address signal including A0-Ai (i is a natural number); a group of data input/output terminals 15 performing data input/output; a Vcc terminal 18 receiving an external power supply potential Vcc; and a Vss terminal 19 receiving a ground potential Vss.

Signal ICS supplied to the group of control signal input terminals 11 is a signal to indicate that the input of control signal to the chip is allowed. Signal CKE is a signal to indicate that the input of the external clock signal ext.CLK to the chip is allowed.

DRAM 1000 further includes a control circuit 26 generating an internal control signal controlling an operation of DRAM 1000 as a whole according to the control signal; an internal control signal bus 72 transmitting the internal control signal; an address buffer 30 receiving the external address signal from the group of address input terminals 13 to generate an internal address signal; and a memory cell array 100 having a plurality of memory cells MC arranged in a matrix.

Memory cell MC is constituted of a capacitor for storing data and an access transistor TM having a gate connected to a word line WL corresponding to a row (not shown).

In a memory cell array 100, one word line WL is arranged for each row of the memory cell and bit lines $BL_x$/BL are arranged for each column of the memory cell.

A row and a column of the memory cell are selected by a row decoder 40 and a column decoder 50 according to the internal address signal transmitted via an address bus 74.

In response to an output of row decoder 40, a corresponding word line WL is selectively activated by a word line driver 45. A column select signal is activated by column decoder 50. The column select signal is supplied to a column select circuit 200 via a column select line 52. Column select circuit 200 selectively connects a sense amplifier 60 amplifying data on bit line pair $BL_x$/BL to an I/O line 76 according to the column select signal. I/O line 76 performs transmission of storage data to/from a data input/output terminal 15 via a read amplifier/write driver 80 and an input/output buffer 85. Thus, transmission of storage data between data input/output terminal 15 and memory cell MC is performed.

The control circuit outputs a signal ZSRM for indicating to the internal circuitry that the operation mode is a self refresh mode when a combination of the external control signals specifies the self refresh mode, and performs operations such as the generation of the internal address for performing the self refresh operation, to control the self refresh mode operation of DRAM 1000.

DRAM 1000 further includes an internal potential generation circuit 2000 generating the internal power supply potential Vdds to be supplied to sense amplifier 60 according to an "H" level potential of the bit line pair.

As described above, as a solution to the problem of sense operation delay caused by the transient decrease of internal power supply potential Vdds supplied from internal potential generation circuit 2000 at the initiation of the sense operation in the structure of DRAM 1000 as shown in FIG. 1, a structure is conceivable where decouple capacitance Cpb present on an interconnection supplying the internal power supply potential to sense amplifier S/A from internal potential generation circuit 2000 is previously precharged to a higher potential than a potential to be written to the memory cell as an "H" data.

Figure 2:
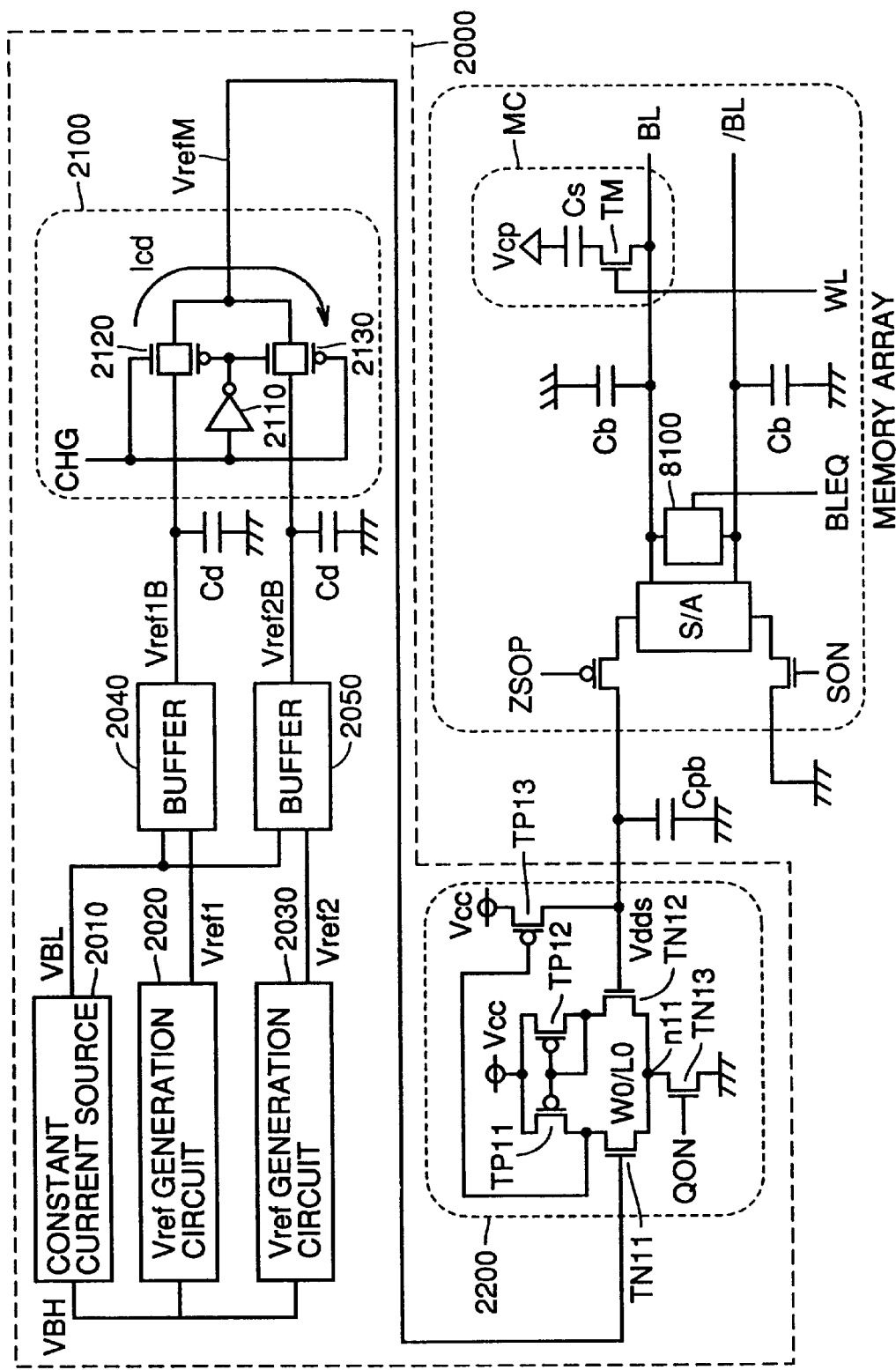
FIG. 2 is a schematic block diagram showing a structure of a preboost type internal potential generation circuit 2000.

FIG. 2 is a schematic block diagram showing a structure of such a preburst type internal potential generation circuit 2000.

Figure 17:
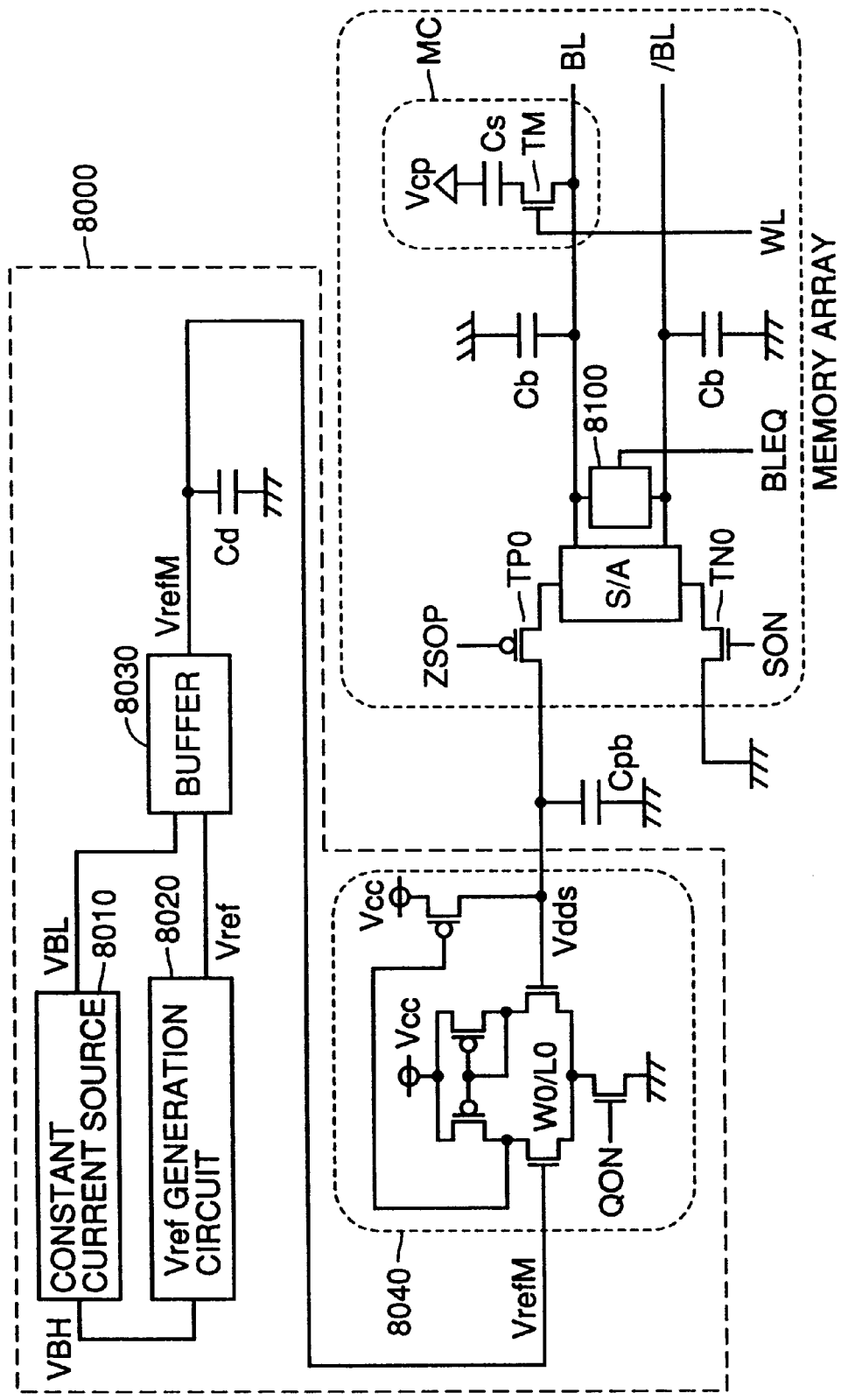
FIG. 17 is a schematic block diagram referenced for describing a structure of a conventional internal potential generation circuit 8000.

The difference with the conventional internal potential generation circuit 8000 shown in FIG. 17 is that the level of reference potential VrefM is not fixed and switched between a potential level Vref1B and a potential level Vref2B according to an operation mode.

With reference to FIG. 2, internal potential generation circuit 2000 includes a constant current source 2010 receiving external power supply potential Vcc and ground potential Vss to generate two bias potentials VBH and VBL; a first Vref generation circuit 2020 receiving bias potential VBH to generate a first basic reference potential Vref1; a second Vref generation circuit 2030 receiving bias potential VBH to generate a second basic reference potential Vref2; a buffer circuit 2040 receiving bias potential VBL and a first basic reference potential Vref1 to generate a first reference potential Vref1B; a buffer circuit 2050 receiving bias potential VBL and second basic reference potential Vref2 to generate a second reference potential Vref2B; a switching circuit 2100 receiving first and second reference potentials Vref1B and Vref2B, supplying one of them as a reference potential VrefM according to a mode select signal CHG generated by control circuit 26; and a voltage conversion circuit 2200 receiving reference potential VrefM to generate internal power supply potential Vdds to be supplied to sense amplifier S/A.

Switching circuit 2100 includes an inverter 2110 receiving and inverting signal CHG; a transmission gate 2120 controlled by signal CHG and an output of inverter 2110, receiving first reference potential Vref1B, turned to be conductive when signal CHG is at an "H" level and supplying first reference potential Vref1B as reference potential VrefM; and a transmission gate 2130 controlled by signal CHG and an output of inverter 2110, receiving second reference potential Vref2B, turned to be conductive when signal CHG is at an "L" level and supplying second reference potential Vref2B as reference potential VrefM.

Voltage conversion circuit 2200 includes a p-channel MOS transistor TP11 and an n-channel MOS transistor TN11 connected in series between an internal node n11 and power supply potential Vcc; a p-channel MOS transistor TP12 and an n-channel MOS transistor TN12 connected in series between power supply potential Vcc and internal node n11; an n-channel MOS transistor TN13 connected between internal node n11 and ground potential Vss; and a p-channel MOS transistor TP13 connected between power supply potential Vcc and a gate of transistor TN12 and having a gate receiving a potential of a connection node of transistors TP11 and TN11.

A gate of transistor TP11 and a gate of transistor TP12 are connected to each other and the gate of transistor TP12 is also connected to a drain of transistor TP12.

A gate of transistor TN 11 receives reference potential VrefM and a potential level of a gate of transistor TN12 corresponds to internal power supply potential Vdds.

Transistor TN13 receives signal QON indicating the initiation of the operation of the voltage conversion circuit.

Here, transistor TN12 and transistor TN11 receiving reference potential VrefM are assumed to have gate width W0 and gate length L0.

Figure 3:
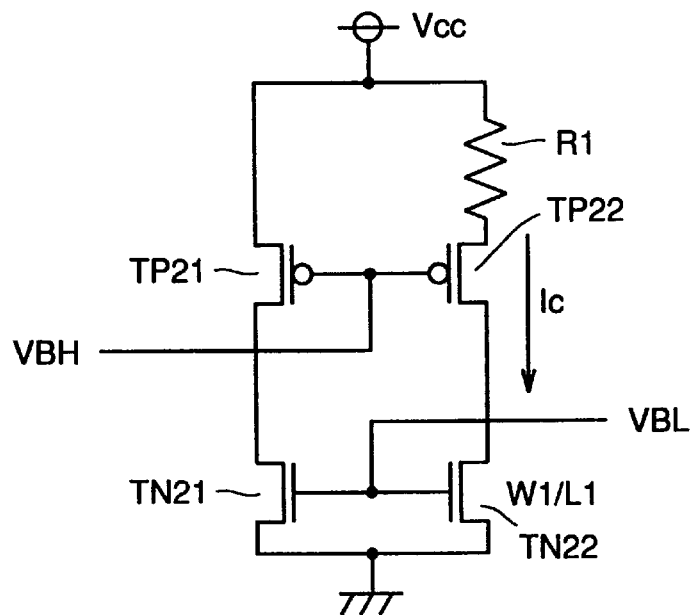
FIG. 3 is a circuit diagram referenced for describing a structure of a constant current source 2010 shown in FIG. 2.

FIG. 3 is a circuit diagram referenced for describing a structure of constant current source 2010 shown in FIG. 2.

Constant current source 2010 includes a p-channel MOS transistor TP21 and an n-channel MOS transistor TN21 connected in series between power supply potential Vcc and ground potential Vss, and a resistance R1, a p-channel MOS transistor TP22 and an n-channel MOS transistor TN22 connected in series between power supply potential Vcc and ground potential Vss.

A gate of transistor TP21 and a gate of transistor TP22 are commonly connected, and potential levels of these gates are output as bias potential VBH. On the other hand, a gate of transistor TN21 and a gate of transistor TN22 are also connected to each other, and potential levels of these gates are output as bias potential VBL.

Here, transistors TN21 and TN22 are assumed to have gate width W1 and gate length L1. Here, a through current Ic constantly flows through constant current source 2010.

Figure 4:
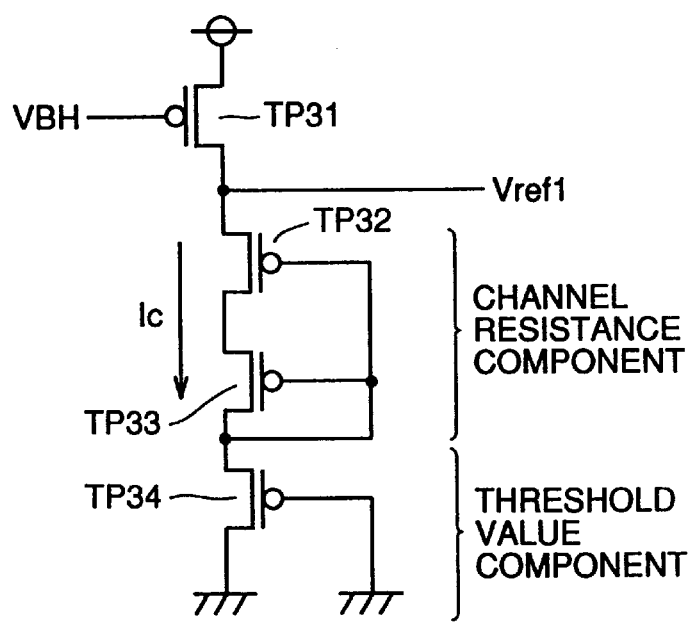
FIG. 4 is a circuit diagram referenced for describing a structure of a first Vref generation circuit 2020 shown in FIG. 2.

FIG. 4 is a circuit diagram referenced for describing a structure of first Vref generation circuit 2020 shown in FIG. 2.

Here, second Vref generation circuit 2030 is basically of the same structure with first Vref generation circuit 2020 except that it includes a different number of transistors connected in series in order to modify the reference potential level to be generated.

First Vref generation circuit 2020 includes p-channel MOS transistors TP31, TP32, TP33 and TP34 connected in series between power supply potential Vcc and ground potential Vss.

A gate of transistor TP31 receives bias potential VBH and a gate of transistor TP34 receives ground potential Vss.

Gates of transistors TP32 and TP33 are both connected to a connection node of transistors TP33 and TP34.

A potential level of a connection node of transistors TP31 and TP32 is output as first basic reference potential Vref1.

The above described connection results in the voltage drop in a portion of transistors TP32 and TP33 attributable to a channel resistance component and the voltage drop in transistor TP34 corresponding to the amount of threshold voltage of the transistor.

As bias potential VBH is supplied to the gate of transistor TP31, a through current Ic equal to through current Ic that flows through constant current source 2010 flows through transistors TP31–TP34.

As described above, second Vref generation circuit 2030 is formed to include a smaller number of series connected transistors than in a structure of first Vref generation circuit 2020, that includes transistors TP32–TP34 as shown in FIG. 4, in order to generate second basic reference potential Vref2 of a lower level than first basic reference potential Vref1, for example.

Figure 5:
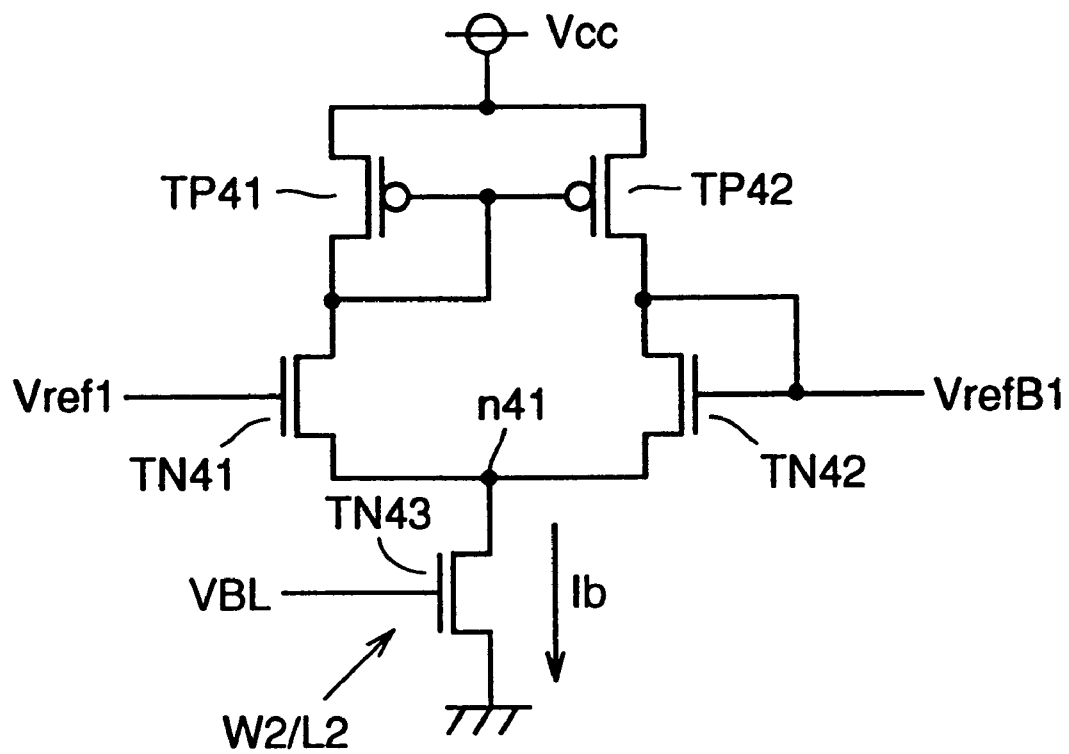
FIG. 5 is a circuit diagram referenced for describing a structure of a first buffer circuit 2040 shown in FIG. 2.

FIG. 5 is a circuit diagram referenced for describing a structure of first buffer circuit 2040 shown in FIG. 2.

Second buffer circuit 2050 basically has the same structure as that of the first buffer circuit 2040 except that the potential level of input basic reference potential is different from the level of output reference potential.

With reference to FIG. 5, first buffer circuit 2040 includes a pchannel MOS transistor TP41 and an n-channel MOS transistor TN41 connected in series between power supply potential Vcc and internal node n41; a p-channel MOS transistor TP42 and an n-channel MOS transistor TN42 connected in series between power supply potential Vcc and internal node n41; and a transistor TN43 connected between internal node n41 and ground potential Vss.

A gate of transistor TP41 and a gate of transistor TP42 are connected to each other and these gates are connected to a connection node of transistors TP41 and TN41.

The gate of transistor TN41 receives first basic reference potential Vref1.

The gate of transistor TN42 is connected to a drain of transistor TN42 and the potential level of this gate is output as first reference potential VrefB1.

A gate of transistor TN43 receives second bias potential VBL. Here, transistor TN43 has gate width W2 and gate length L2. Then, a through current Ib flows through buffer circuit 2040.

Thus, the same current Ic as that generated at constant current source 2010 flows in first and second Vref generation circuits 2020 and 2030. In first and second Vref generation circuits 2020 and 2030, basic reference potentials Vref1 and Vref2 are generated, respectively, by changing the number of transistors connected in series and thus modifying the amount of voltage drop by channel resistance. Further based on basic reference potentials Vref1 and Vref2, reference potentials Vref1B and Vref2B ale generated in first and second buffer circuits 2040 and 2050, respectively.

Here, the level of first reference potential Vref1B is equal to the level of first basic reference potential Vref1, and, the level of second reference potential Vref2B is equal to the level of second basic reference potential Vref2.

Through current Ib of buffer circuit 2040 is represented by the following expression (1).

$$Ib=(W2/L2)/(W1/L1) \times Ic \qquad (1)$$

Therefore, the output of the buffer circuit can be maintained at a stable level by increasing the ratio $(W2/L2)/(W1/L1)$ in the expression (1).

In addition, the following expression (2) holds between first reference potential Vref1B and second reference potential Vref2B.

$$Vref1B > Vref2B \qquad (2)$$

Here, the potential written into a memory cell as an "H" data is assumed to be equal to the level of potential Vref2B.

Figure 6:
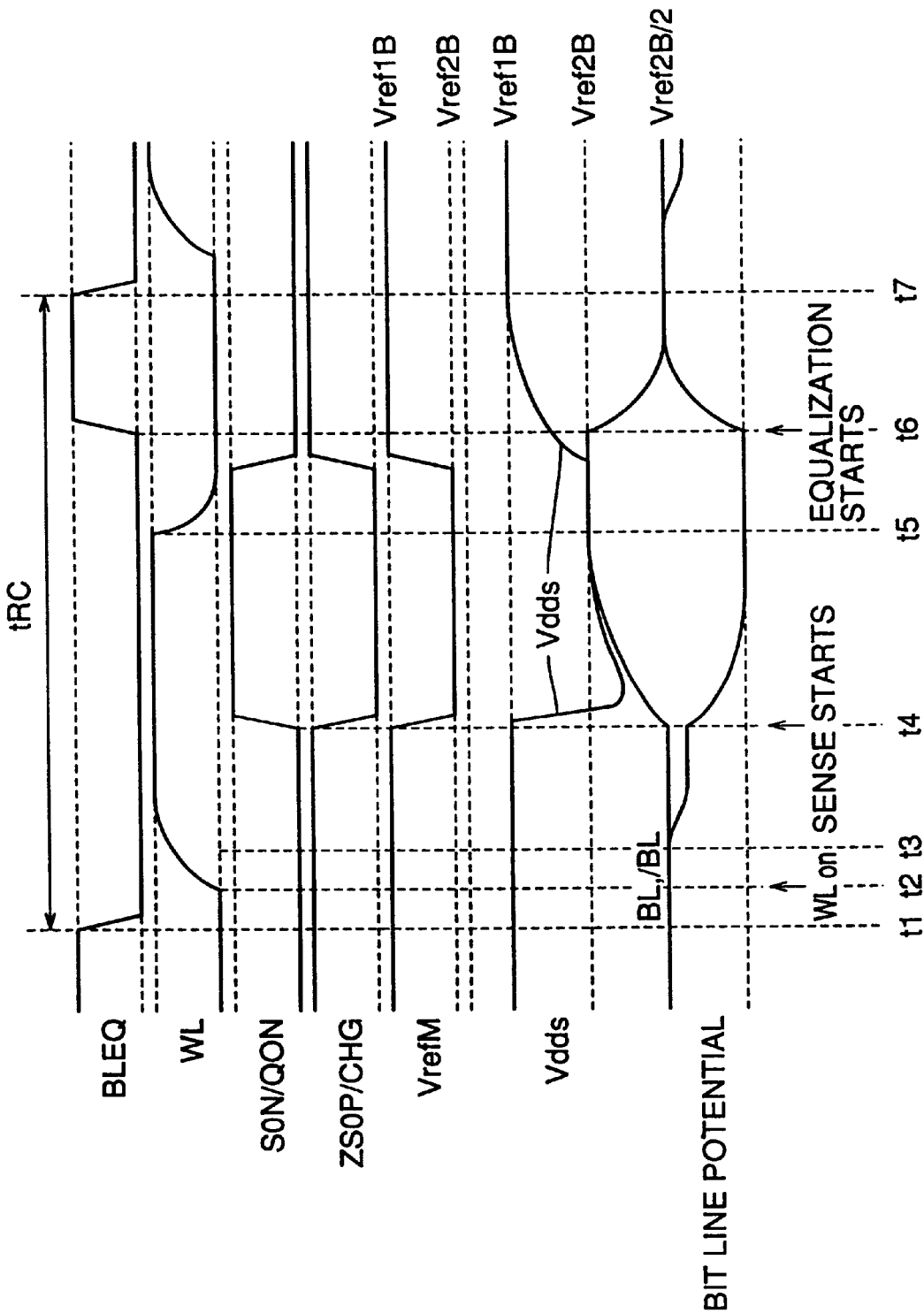
FIG. 6 is timing charts referenced for describing a sense operation in DRAM 1000 employing a voltage down converting circuit 2000 shown in FIG. 2.

FIG. 6 is timing charts referenced for describing the sense operation in DRAM 1000 employing voltage down converting circuit 2000 shown in FIG. 2.

At time t1, an equalizing operation of the bit line pair is suspended and signal BLEQ is turned from an "H" level to an "L" level.

Then at time t2, a word line WL is selected according to an address signal given from an external source and the potential level of the selected word line WL is turned to an active state.

Along with the activation of the word line WL, at time t3, potential difference is generated between paired bit lines BL and /BL corresponding to data stored in the selected memory cell.

At time t4, the initiation of operation of sense amplifier is indicated and signal SON and signal QON are turned to an "H" level. On the other hand, signals ZSOP and signal CHG are turned from an "H" level to an "L" level.

Along with the change in the state of signal CHG, the level of reference potential VrefM changes from the level of potential Vref1B to the level of potential Vref2B.

Therefore, signal SON is at an "L" level, signal ZSOP is at an "H" level and reference potential VrefM is at the level of first reference potential Vref1B until the initiation of the sense operation. Hence, larger electric charges are stored in decoupling capacitance Cpb by the initiation of sense operation than in the case where reference potential VrefM is at the level of Vref2B by an amount represented by the following expression (3).

$$Cpb \times (Vref1B - Vref2B) \qquad (3)$$

At time t4, signal SON is turned to an "H" level and signal ZSOP is turned to an "L" level thereby indicating the initiation of the sense operation. Then, the electric charges stored in decoupling capacitance Cpb start to be charged into charge/discharge capacitance Cb present in a bit line pair.

After the initiation of the sense operation at time t4, transient decrease of the level of internal power supply potential Vdds that occurred at the earlier phase of the sense operation is suppressed because of the presence of larger charges in decoupling capacitance Cpb by an amount shown by the above expression (3).

In addition, after time t4, the level of reference potential VrefM is at the level of second reference potential Vref2B. Therefore, voltage conversion circuit 2200 supplies electric charges to the sense amplifier S/A to keep the level of internal power supply potential Vdds equal to that of potential Vref2B.

At time t5, the word line is inactivated. Thereafter, sense amplifier drive signal SON, ZSOP are also inactivated. In response thereto, signal CHG returns to an "H" level and the level of reference voltage VrefM is turned to the level of first reference potential Vref1B again.

At time t6, signal BLEQ is activated and the equalization of the bit line pair is initiated.

At time t7, the next cycle starts. Here, the period from time t1 to time t7 is cycle time tRC.

As described above, as the level of an "H" data written to a memory cell is equal to the level of potential Vref2B, eventually, an "H" level data with a desired level is to be written into the memory cell by the above described operation even when the reference potential is switched between two levels.

In addition, with the reduction of transient decrease of internal power supply potential Vdds, the period required for internal potential generation circuit 2000 to increase the level of internal power supply potential Vdds up to the level of reference potential Vref2B is shortened.

Here, a through current Ipa flowing through internal potential generation circuit 2000 with the structure shown in FIG. 2 can be estimated as follows.

First, a through current of $2 \times Ic$ is generated at constant current source 2010, a through current of $2 \times Ic$ is generated at first and second Vref generation circuits 2020 and 2030, and a through current of $2 \times Ib$ is generated at first and second buffer circuits 2040 and 2050.

Thus, the generated through current can be represented as the following expression (4) in total.

$$Ipa = 2 \times Ib + 4 \times Ic \qquad (4)$$

In other words, the above expression (4) represents the current Ipa that flows in the internal potential generation circuit 2000 while the signal QON is "L" level and the circuit 2000 is off.

As described earlier, it is desirable to suppress through current Ipa as low as possible to reduce current Iccsr consumed during the refresh operation and standby current Iccs.

Hence, current Ib flowing through the buffer circuit is set so that a parasitic capacitance Cd present on the output node of the buffer circuit can be charged in a predetermined time immediately after the power on. Here, specifically, through current Ib in the buffer circuit is designed to be a few $\mu A$, for example.

As described in FIG. 2, at the switching of reference potential VrefM, buffer circuits 2040 and 2050 must charge/discharge the gate capacitance of a transistor (transistor TN11) receiving reference potential VrefM in voltage conversion circuit 2200.

When the sense operation is performed at a fixed cycle time tRC, charge/discharge current Icd can be represented by the following expression (5).

$$Icd = C0 \times W0 \times L0 \times (Vref1B - Vref2B)/tRC \qquad (5),$$

where C0 is a gate capacitance of each unit area. Generally, gate area $W0 \times L0$ of transistor TN11 in voltage conversion circuit 2200 receiving reference potential VrefM is set to be large. In addition, in a DRAM capable of high-speed operation, represented by a synchronous DRAM (hereinafter referred to as SDRAM), charge/discharge current Icd cannot be ignored because cycle time tRC is shorter than the conventional devices.

Figure 7:
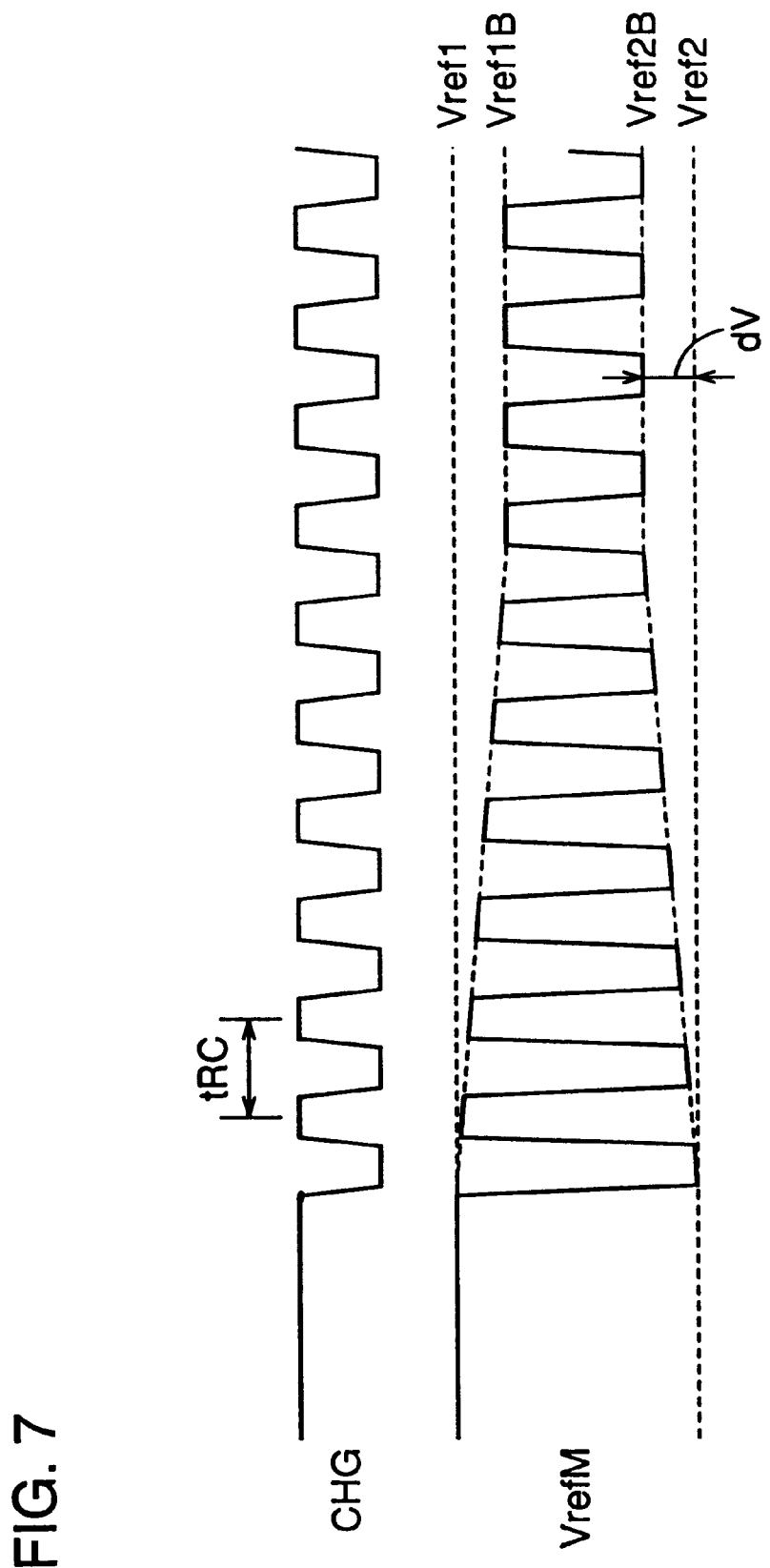
FIG. 7 is charts referenced for describing a transient change of reference potential VrefM caused by charge/discharge current Icd.

FIG. 7 is charts referenced for describing a transient change in reference potential VrefM caused by such charge/discharge current Icd.

With reference to FIG. 7, first and second reference potentials gradually changes their own levels until charge/discharge current Icd balances with current drivability of the buffer circuits 2040 and 2050.

Therefore, the first reference potential Vref1B deviates below from a desired level Vref1 and the second reference potential Vref2B deviates above from a desired level Vref2.

When cycle time tRC is sufficiently short, reference potential Vref2B comes to a steady state at a level off a desired potential level by a voltage deviation dV. Same holds for reference potential Vref1B.

Through current Ib generated at buffer circuits 2040 and 2050 can be set to be constantly large to suppress the variation in the level of reference potentials Vref1B and Vref2B supplied from buffer circuits 2040 and 2050. However, the setting of a large through current Ib is not preferable in view of reduction of current Iccsr and Iccs.

After all, through current Ib must be set to the largest acceptable value in view of the set values of current Iccsr and Iccs.

Therefore, the structure shown in FIG. 2 is not sufficient to suppress the decrease of potential level in a transient state of output potential Vdds from internal potential generation circuit 2000 while reducing current Iccsr and Iccs.

Figure 8:
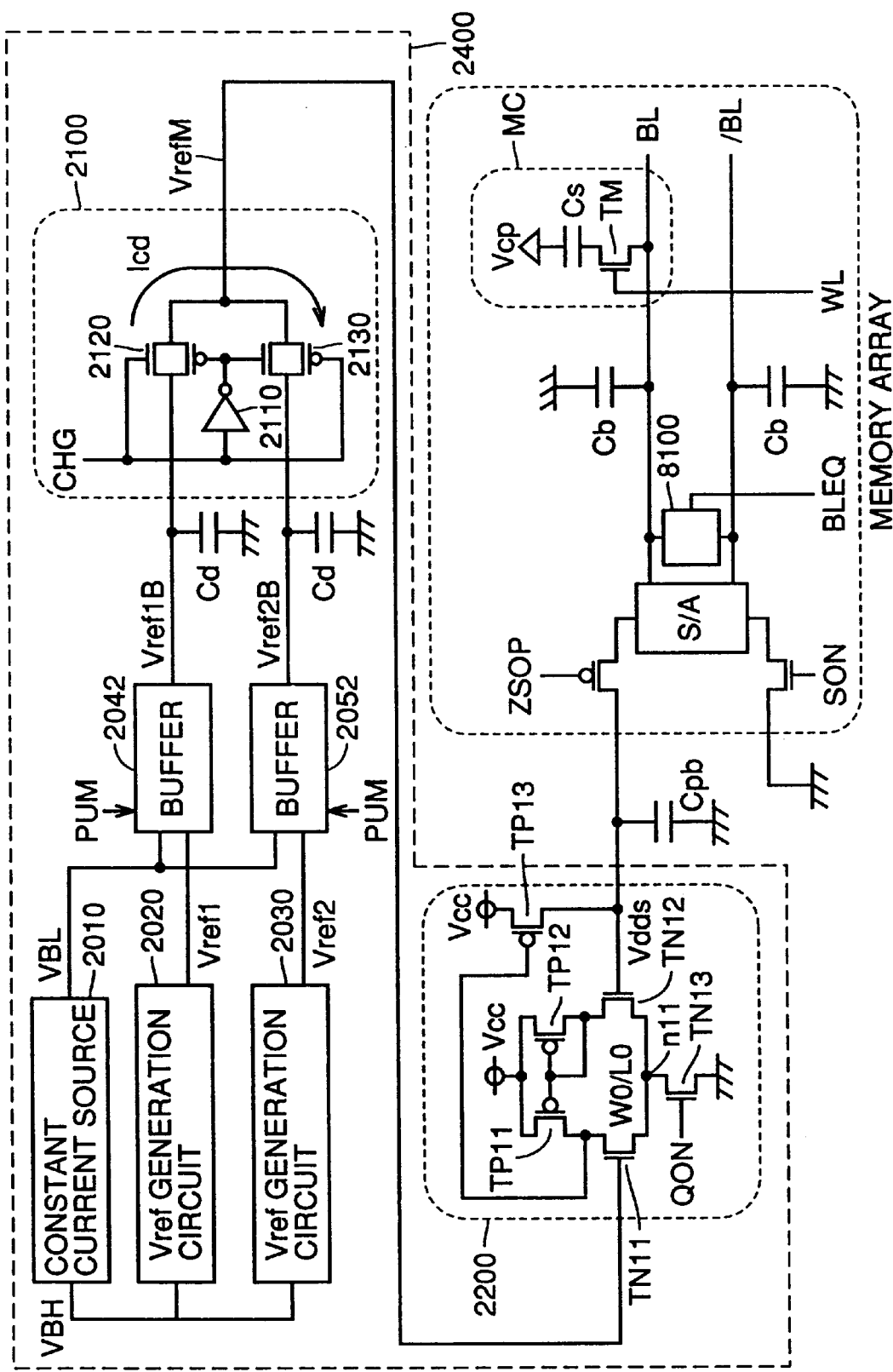
FIG. 8 is a schematic block diagram referenced for describing a structure of internal potential generation circuit 2400.

FIG. 8 is a schematic block diagram referenced for describing a structure of internal potential generation circuit 2400 allowing the reduction of current Iccst and Iccs as described above.

The structure of internal potential generation circuit 2400 is different from that of internal potential generation circuit 2000 shown in FIG. 2 in that buffer circuits 2042 and 2052 are controlled by signal PUM. The structure of circuit 2400 is same with that of circuit 2000 in other respect, and the same reference character is allotted to the same portion and the description thereof will not be repeated.

Figure 9:
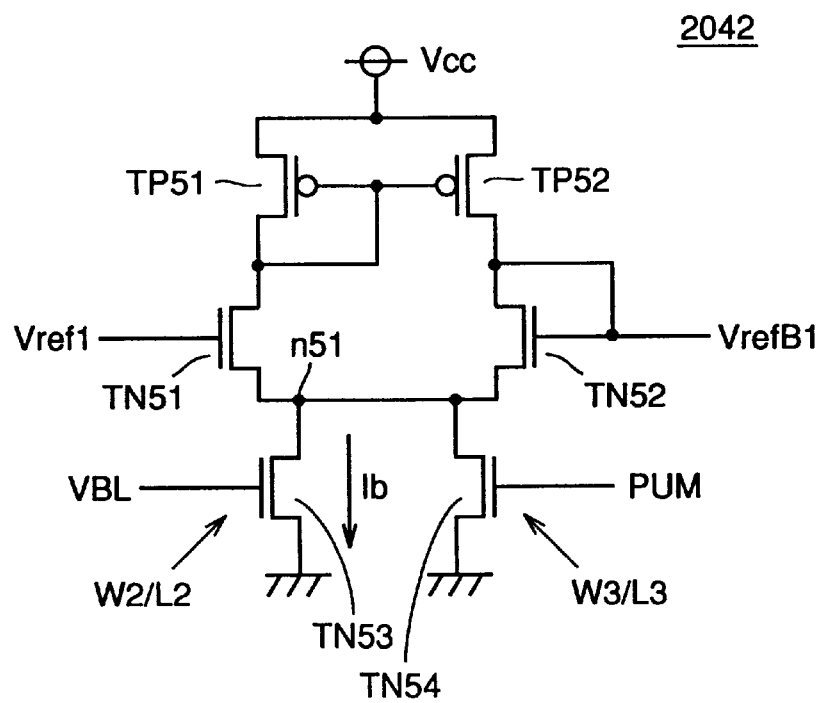
FIG. 9 is a circuit diagram referenced for describing a structure of a first buffer circuit 2042.

FIG. 9 is a circuit diagram referenced for describing a structure of first buffer circuit 2042 shown in FIG. 8.

The structure of second buffer circuit 2052 is basically the same with first buffer circuit 2042 expect that input potential and output potential are different.

First buffer circuit 2042 includes a p-channel MOS transistor TP51 and an n-channel MOS transistor TN51 connected in series between power supply potential Vcc and internal node n51; a p-channel MOS transistor TP52 and an n-channel MOS transistor TN52 connected in series between power supply potential Vcc and internal node n51; an n-channel MOS transistor TN53 connected between internal node n51 and ground potential Vss and having a gate receiving bias potential VBL; and an n-channel MOS transistor TN54 connected between internal node n51 and ground potential Vss and having a gate receiving signal PUM.

A gate of transistor TP51 and a gate of transistor TP52 are connected to each other, and these gates are connected to a connection node of transistor TP51 and transistor TN51.

A gate of transistor TN51 receives first basic reference potential Vref1, whereas a gate of transistor TN52 is connected to a drain of transistor TP52. The gate potential of transistor TN52 is output as first reference potential VrefB1.

Here, transistor TN53 is assumed to have gate width W2 and gate length L2.

On the other hand, transistor TN54 has gate width W3 and gate length L3.

In the structure as shown in FIG. 9, through current Ib flowing through buffer circuit 2042 can be controlled by signal PUM.

Figure 10:
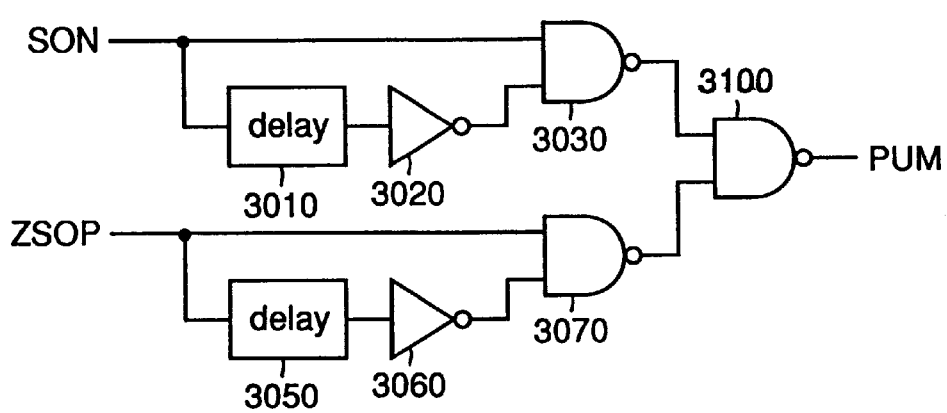
FIG. 10 is a schematic block diagram showing a structure of a PUM signal generation circuit 3000.

FIG. 10 is a schematic block diagram showing a structure of PUM signal generation circuit 3000 for generating signal PUM shown in FIG. 9. PUM signal generation circuit 3000 is included, for example, in control circuit 26 shown in FIG. 1.

With reference to FIG. 10, PUM generation circuit 3000 includes a delay circuit 3010 receiving signal SON; an inverter 3020 receiving and inverting an output of delay circuit 3010; an NAND circuit 3030 receiving signal SON and an output of inverter 3020; a delay circuit 3050 receiving signal ZSOP; an inverter 3060 receiving and inverting an output of delay circuit 3050; an NAND circuit 3070 receiving signal ZSOP and an output of inverter 3060; and an NAND circuit 3100 receiving outputs of NAND circuits 3030 and 3070 and supplying signal PUM as an output.

With the structure of PUM generation circuit 3000 as shown in FIG. 10, signal PUM is turned to an "H" level only during periods starting from the initiation of sense operation and the termination of sense operation and lasting for a duration determined by delay circuits 3010 and 3050. In response to the "H" level PUM signal, through current Ib of buffer circuits 2040 and 2050 shown in FIG. 9 increase to enhance the buffers' drivability.

As a result, charge/discharge current Icd generated by the switching between reference potentials Vref1B and Vref2B falls within the range that can be accommodated by the buffers' drivability, whereby the variation in levels of reference potentials Vref1B and Vref2B can be suppressed.

Figure 11:
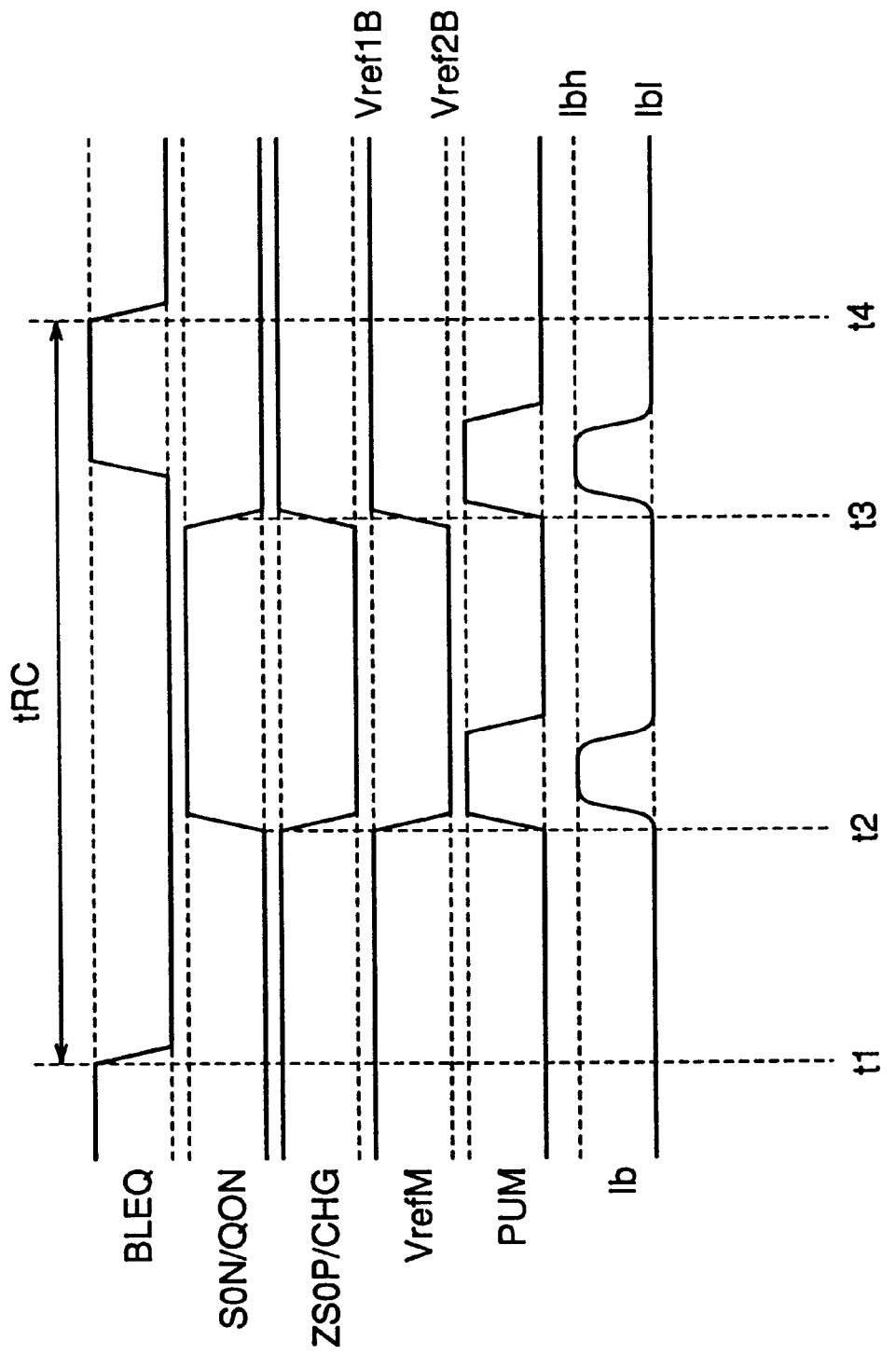
FIG. 11 is timing charts referenced for describing an operation of generating a reference potential of internal potential generation circuit 2400.

FIG. 11 is timing charts referenced for describing an operation of internal potential generation circuit 2400 shown in FIG. 8 generating the reference potential.

At time t1, signal BLEQ is turned to an inactive state, then at time t2, signal SON and signal ZSOP are each turned to an active state. On the other hand, reference potential VrefM is turned from the level of first reference potential Vref1B to the level of second reference potential Vref2B.

In response to the change, signal PUM is turned to and maintained at an active state for a predetermined period and through current Ib in buffer circuits 2040 and 2050 increases from the level of current amount Ibl to the level of current amount Ibh only for the period signal PUM is active.

Then at time t3, as the signal SON and signal ZSOP are turned to an inactive state, signal PUM assumes an active state again only for a predetermined period.

On the other hand, reference potential VreM is turned from the level of second reference potential Vref2B to the level of first reference potential Vref1B.

During the period reference potential VrefM is switched, through current Ib of buffer circuits 2040 and 2050 increases from the level Ibl to the level Ibh.

By suppressing through current Ib during the period while signal PUM is at an "L" level to the minimum value Ib1 required for charging parasitic capacitance Cd at the time of power on, through current Ib can be set low compared with the case where the buffer circuit is not controlled by signal PUM. As a result, through current Ib of buffer circuits 2040 and 2050 is mostly at the level Ib1 especially when cycle time tRC is long, whereby the average value of through current Ib can be suppressed.

Hence, the reduction of current Iccsr and Iccs can be achieved in the structure as shown in FIG. 8.

Though in the above example, activation signal SON and ZSOP of the sense amplifier are employed as the signal for determining the duration of an "H" level PUM signal, various other signals relating to the operation of rows can be employed as well.

For example, an internal signal supplied from an external source and directly corresponding to a control signal/command leading to the activation of circuitry relating to the rows, or bit line equalizing signal BLEQ that is in an active state while the sense amplifier is inactive can be used.

Second Embodiment

The structure of the internal potential generation circuit according to the second embodiment is basically the same with the structure of the internal potential generation circuit according to the first embodiment shown in FIG. 8.

Though the timing of the activation of signal PUM is different.

In internal potential generation circuit 2400 according to the first embodiment shown in FIGS. 8 to 10, the timing signal QON, that indicates activation of voltage conversion circuit 2200, is turned to an "H" level is synchronized with the timing of activation of signal SON that indicates the activation of the sense amplifier.

In general, however, it takes a little time until a regular operation starts after the activation of voltage conversion circuit 2200. Hence, in some cases, signal QON is turned to an active state ("H" level) before the initiation of sense operation.

In PUM signal generation circuit 4000 according to the second embodiment, signal PUM is turned to an active state at an earlier timing than the switching of reference potential VrefM through the synchronization of the timing of the generation of signal PUM with signal QON.

Figure 12:
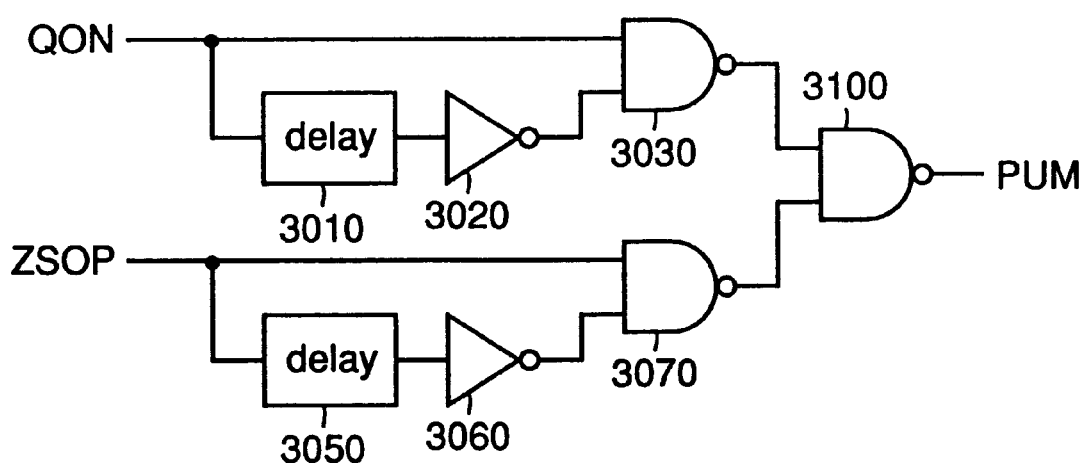
FIG. 12 is a schematic block diagram showing a structure of a PUM signal generation circuit 4000 according to the second embodiment of the present invention.

FIG. 12 is a schematic block diagram showing a structure of PUM signal generation circuit 4000 according to the second embodiment of the present invention. PUM signal generation circuit 4000 is different from PUM signal generation circuit 3000 according to the first embodiment shown in FIG. 10 in that signal QON is employed instead of signal SON. In other respects, two structures are the same and the same portion will be denoted by the same reference character and the description thereof will not be repeated.

Figure 13:
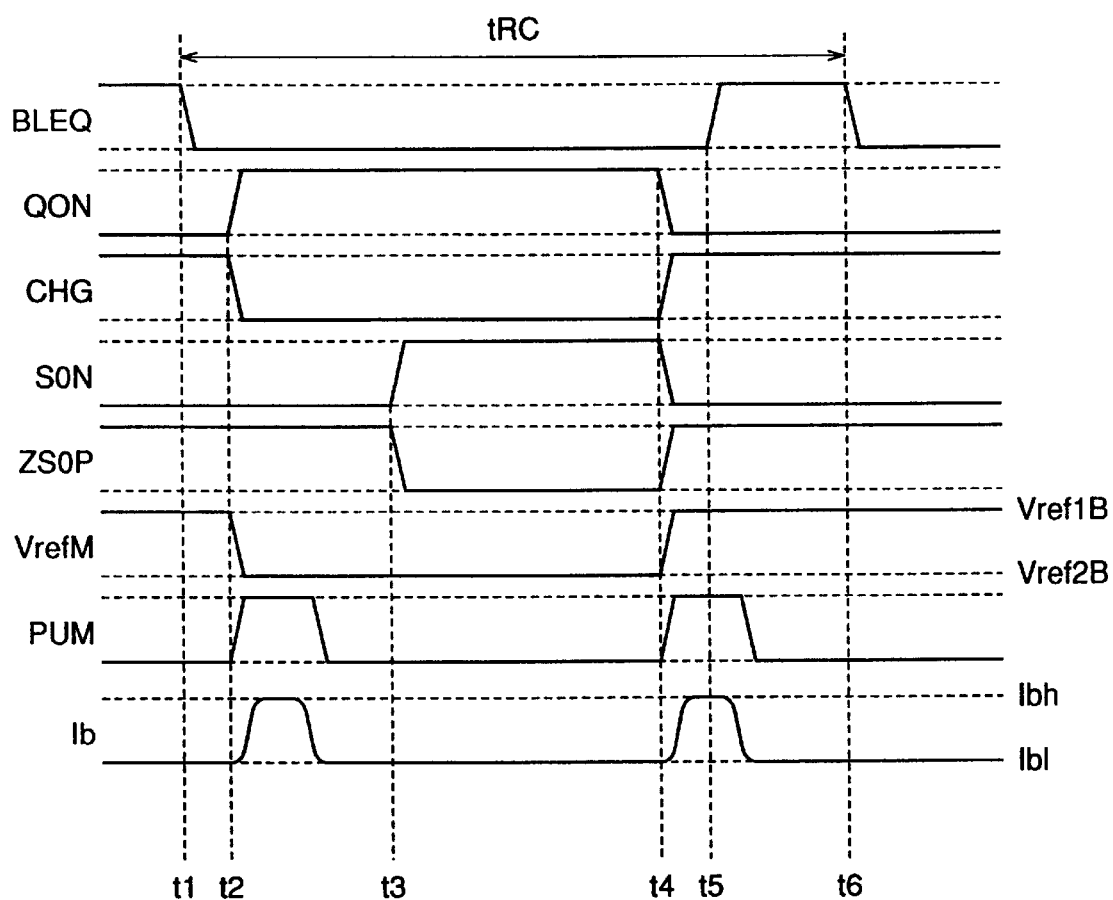
FIG. 13 is timing charts referenced for describing an operation of the internal potential generation circuit when PUM signal generation circuit 4000 is used.

FIG. 13 is timing charts referenced for describing an operation of the internal potential generation circuit when PUM signal generation circuit 4000 as shown in FIG. 12 is employed.

At time t1, signal BLEQ is inactivated, and at time t2 signal QON is turned to an active state and voltage conversion circuit 2200 is activated. At time t2, with the transition of signal CHG to an "L" level, reference potential VrefM is also switched from first reference potential Vref1B to second reference potential Vref2B. In response to this change, signal PUM is turned to an active state for a predetermined period and through current Ib in buffer circuits 2040 and 2050 is also increased from the level Ibl to the level Ibh. Thereafter, at time t3, with the activation of signal SON and signal ZSOP, the sense operation is activated.

With this structure, it is possible to suppress the variation in potential caused by the interference between reference potential in a circuit structure where a plurality of reference potentials are generated.

When the internal potential generation circuit according to the second embodiment is employed for supplying the driving potential to the sense amplifier of the DRAM, for example, at the point the sense amplifier starts to consume internal power supply potential Vdds in the sense operation, voltage conversion circuit 2200 has already started its normal operation, and therefore, voltage conversion circuit 2200 can starts supplying electric charges to render internal power supply potential Vdds matched with second reference potential Vref2B earlier. As a result, besides the effect obtained in the first embodiment, another effect can be obtained, that is, the transient variation in the level of power supply potential Vdds can be suppressed even more firmly and the time required for sense operation can be reduced.

Third Embodiment

In the structures according to the first and the second embodiments, when the internal potential generation circuit is employed in the DRAM, a through current in a relating circuit portion can be suppressed both in the normal mode at a standby state and in the self refresh mode.

In the normal mode, however, through current Ipa is not always important with respect to overall power consumption because it is not particularly large and invisible among other current components consumed by other portions. On the other hand, in the self refresh mode, in some cases, enhancement of buffering capability is not required because of a sufficiently long cycle time tRC and a sufficiently small charge/discharge current Icd.

Therefore, the buffering capability can be controlled based on the determination whether the DRAM is in the self refresh mode or not.

Figure 14:
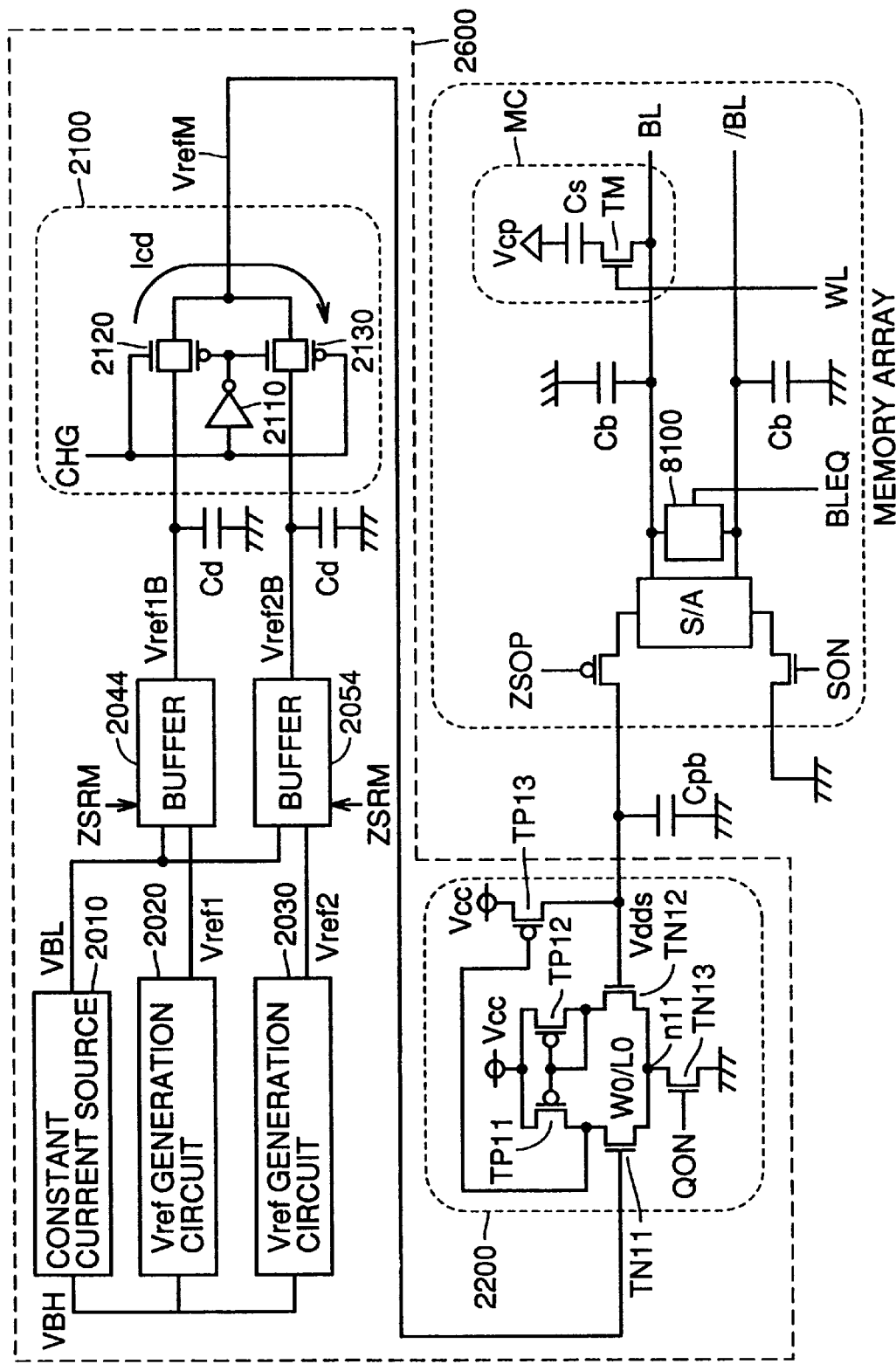
FIG. 14 is a schematic block diagram showing a structure of internal potential generation circuit 2600 according to the third embodiment of the present invention.

FIG. 14 is a schematic block diagram showing a structure of internal potential generation circuit 2600 according to the third embodiment of the present invention.

The structure is different from reference potential generation circuit 2400 according to the first embodiment shown in FIG. 8 in that buffer circuits 2044 and 2054 are controlled by signal ZSRM indicating the designation of the self refresh mode. In other respects, the structure is same with the structure shown in FIG. 8 and the same portion will be denoted by the same reference character and the description thereof will not be repeated.

Figure 15:
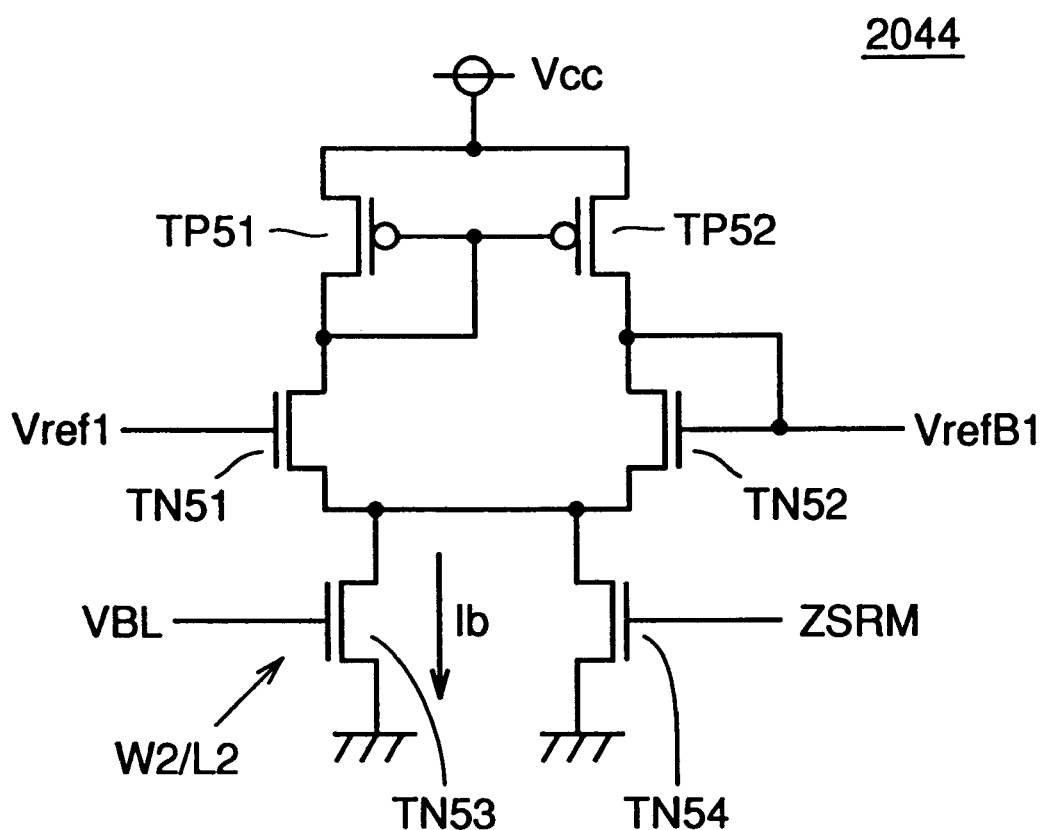
FIG. 15 is a circuit diagram referenced for describing a structure of buffer circuit 2044 according to the third embodiment of the present invention.

FIG. 15 is a circuit diagram referenced for describing a structure of buffer circuit 2044 according to the third embodiment of the present invention.

Buffer circuit 2044 is different from the buffer circuit according to the first embodiment shown in FIG. 9 only in that the gate of transistor TN54 is not controlled by signal PUM but by signal ZSRM. Hence, the same portion will be denoted by the same reference character and the description thereof will not be repeated.

Figure 16:
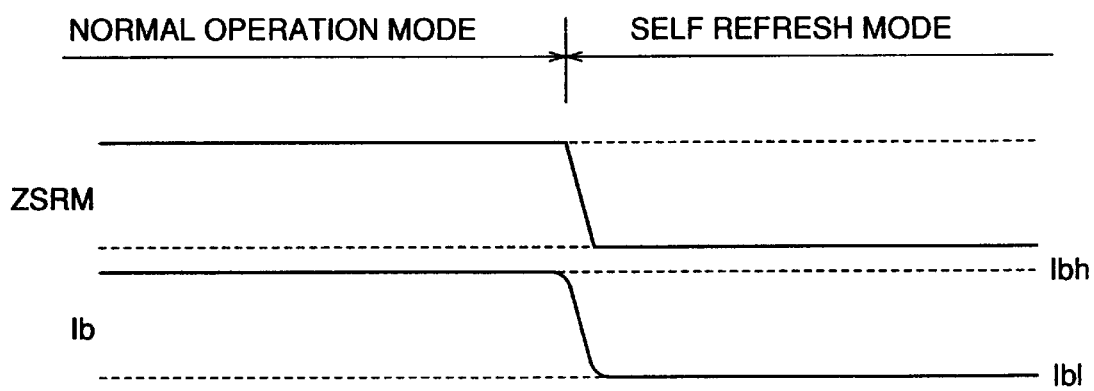
FIG. 16 is timing charts referenced for describing an operation of an internal potential generation circuit according to the third embodiment of the present invention.

FIG. 16 is timing charts referenced for describing an operation of the internal voltage generation circuit according to the third embodiment of the present invention. In the normal operation mode, signal ZSRM is at an "H" level and through current Ib in buffer circuits 2044 and 2054 is controlled to be a higher level Ibh.

On entering the self refresh mode, signal ZSRM is turned to an "L" level and through current Ib in buffer circuits 2040 and 2050 is controlled to be a lower level Ibl.

Such structure is particularly effective when a system requirement toward standby current Iccs is not stringent.

Though in the above description, the present invention is described as being applied to a structure of an internal potential generation circuit supplying an internal power supply potential to a sense amplifier S/A in a circuit structure of a DRAM, such structure can be applied to other structures in general. In other words, an internal potential generation circuit or a structure of generating a reference potential according to the present invention is not limited to a structure of an internal potential generation circuit generating two different types of potential as the internal potential.

For example, the present invention described above can be applied to a circuit system where a gate of an MOS transistor in a certain circuit receives an output from an internal potential generation circuit that generates a plurality of intermediate potentials and switches the output from one of the intermediate potentials to another. The present invention is utilized in the circuit system for suppressing the fluctuation of the intermediate potential itself through the switching operation. The present invention is also applicable in an internal potential generation circuit or in a structure generating a reference potential, for suppressing a through current.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a reference potential generation circuit receiving an power supply potential and selectively outputting one of a plurality of reference potentials according to an operation mode;
   said reference potential generation circuit including,
      a plurality of potential generation circuits each generating one of said plurality of reference potentials and increasing a current driving capability at least for a predetermined time period after the transition of said operation mode, and
      a switching circuit receiving outputs of said plurality of potential generation circuits and supplying one of said outputs according to said operation mode; and
   an internal circuit operating based on the output of said reference potential generation circuit.

2. The semiconductor device according to claim 1, wherein said potential generation circuits each include
   a basic reference potential generation circuit generating a basic reference potential corresponding to said reference potential to be generated, and
   a buffer circuit supplying said reference potential as an output according to said basic reference potential,
   said buffer circuit includes
      an output node,
      a drive circuit receiving said power supply potential and driving a potential level of said output node to said reference potential according to said basic reference potential, and
      a current control circuit enhancing a current flow through said drive circuit in an active state at least for said predetermined time period after the transition of said operation mode.

3. The semiconductor device according to claim 2, wherein
   a current path through said drive circuit includes first and second paths parallel to each other and
   said current control circuit includes
      a pulse signal generation circuit generating a pulse signal which maintains an active state for said predetermined time period in response to the transition of said operation mode, and
      a switching circuit provided on said second path and turned to a conductive state in response to an activation of said pulse signal.

4. The semiconductor device according to claim 2, wherein
   a current path through said drive circuit includes first and second paths parallel to each other and
   said current control circuit includes
      a mode signal generation circuit generating a mode specifying signal according to said operation mode, and
      a switching circuit provided on said second path and turned to a conductive state in response to an activation of said mode specifying signal.

5. A semiconductor device comprising:
   an internal circuit driven by an internal potential;
   an interconnection transmitting said internal potential to said internal circuit; and
   an internal potential generation circuit receiving an power supply potential and selectively supplying to said interconnection one of a first potential and a second potential higher than said first potential as the internal potential according to an operation mode of said internal circuit,
   said internal potential generation circuit including
      a reference potential generation circuit supplying as an output one of first and second reference potentials corresponding to said first and said second potentials, respectively, according to said operation mode and increasing a current driving capability at least for a predetermined time period after the transition of said operation mode, and
      a voltage conversion circuit having an input node which receives the output of said reference potential generation circuit and generating said internal potential,
      said voltage conversion circuit including an MOS transistor having a gate coupled to said input node.

6. The semiconductor device according to claim 5 wherein said reference potential generation circuit includes
   a first basic reference potential generation circuit generating a first basic reference potential corresponding to said first reference potential;
   a second basic reference potential generation circuit generating a second basic reference potential corresponding to said second reference potential;
   a first buffer circuit supplying said first reference potential as an output according to said first basic reference potential;
   a second buffer circuit supplying said second reference potential as an output according to said second basic reference potential;
   said first buffer circuit and said second buffer circuit each has,
      an output node, and
      a drive circuit receiving said power supply potential and being capable of changing a current flow through said drive circuit to drive a potential level of said output node to a corresponding one of said first and said second reference potentials according to a corresponding one of said first and second basic reference potentials by enhancing said current flow through said drive circuit in an active state at least for said predetermined time period after the transition of said operation mode; and
   a switching circuit receiving outputs of said first and second buffer circuits and selectively supplying as an output one of said outputs according to said operation mode.

7. The semiconductor device according to claim 6 wherein a current path through said drive circuit includes first and second paths parallel to each other, and said drive circuit includes a switching circuit provided on said second path and turned to a conductive state according to an activation of a pulse signal which maintains an active state for said predetermined time period after the transition of said operation mode.

8. The semiconductor device according to claim 6 wherein a current path through said drive circuit includes first and second paths parallel to each other, and said drive circuit includes a switching circuit provided on said second path and turned to a conductive state according to an activation of a mode specifying signal designating said operation mode.

9. The semiconductor device according to claim 5 wherein said voltage conversion circuit is turned to an active state from an inactive state before the transition of said operation mode.

10. The semiconductor device according to claim 5 wherein said internal circuit includes a control circuit controlling an operation of said internal circuit according to a supplied control signal;

a memory cell array including a plurality of dynamic type memory cells arranged in a matrix;

a plurality of bit line pairs provided corresponding to columns of said memory cells;

a memory cell select circuit selecting one of said memory cells according to an address signal;

a plurality of sense amplifiers amplifying a potential of a bit line pair coupled to the selected memory cell based on data held in said selected memory cell; and a sense amplifier drive circuit controlled by said control circuit to control a supply of said internal potential to said sense amplifier; and the transition of said operation mode corresponds to a transition of sense operation by the sense amplifier between an active state and an inactive state.

11. The semiconductor device according to claim 5 wherein said reference potential generation circuit includes a first basic reference potential generation circuit generating a first basic reference potential corresponding to said first reference potential;

a second basic reference potential generation circuit generating a second basic reference potential corresponding to said second reference potential;

a first buffer circuit supplying said first reference potential as an output according to said first basic reference potential;

a second buffer circuit supplying said second reference potential as an output according to said second basic reference potential;

said first buffer circuit and said second buffer circuit each has, an output node, and a drive circuit receiving said power supply potential and being capable of changing a current flow through said drive circuit to drive a potential level of said output node to a corresponding one of said first and said second reference potentials according to a corresponding one of said first and second basic reference potentials by decreasing the current flow through said drive circuit according to the transition of said operation mode; and a switching circuit receiving outputs of said first and second buffer circuits and selectively supplying as an output one of said outputs according to said operation mode, and said internal circuit includes a control circuit controlling an operation of said internal circuit according to a supplied control signal;

a memory cell array including a plurality of dynamic type memory cells arranged in a matrix;

a plurality of bit line pairs provided corresponding to columns of said memory cells;

a memory cell select circuit selecting one of said memory cells according to an address signal;

a plurality of sense amplifiers amplifying a potential of a bit line pair coupled to the selected memory cell based on data held in said selected memory cell; and a sense amplifier drive circuit controlled by said control circuit to control a supply of said internal potential to said sense amplifier; and the transition of said operation mode corresponds to a transition of said internal circuit to a self refresh operation mode.

* * * * *